United States Patent
Jeon

(10) Patent No.: US 9,041,000 B2
(45) Date of Patent: May 26, 2015

(54) THIN FILM TRANSISTOR ARRAY SUBSTRATE HAVING NON LINEAR ACTIVE LAYER AND ORGANIC LIGHT EMITTING DISPLAY APPARATUS INCLUDING THE SAME

(71) Applicant: Samsung Display Co., Ltd., Yongin, Gyeonggi-Do (KR)

(72) Inventor: Mu-Kyung Jeon, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/096,962

(22) Filed: Dec. 4, 2013

(65) Prior Publication Data

US 2015/0021561 A1  Jan. 22, 2015

(30) Foreign Application Priority Data

Jul. 19, 2013 (KR) ........................ 10-2013-0085696

(51) Int. Cl.

| | |
|---|---|
| H01L 27/14 | (2006.01) |
| H01L 29/04 | (2006.01) |
| H01L 29/15 | (2006.01) |
| H01L 31/036 | (2006.01) |
| H01L 29/18 | (2006.01) |
| H01L 33/00 | (2010.01) |
| H01L 27/148 | (2006.01) |
| H01L 27/32 | (2006.01) |
| H01L 29/786 | (2006.01) |
| G09G 3/32 | (2006.01) |
| G06F 3/038 | (2013.01) |
| G09G 5/00 | (2006.01) |

(52) U.S. Cl.
CPC .......... *H01L 27/3244* (2013.01); *H01L 29/786* (2013.01)

(58) Field of Classification Search
None
See application file for complete search history.

(56) References Cited

U.S. PATENT DOCUMENTS

| | | | |
|---|---|---|---|
| 2002/0089616 | A1 | 7/2002 | Hashimoto et al. |
| 2008/0029768 | A1* | 2/2008 | Asano et al. ..................... 257/72 |
| 2011/0063275 | A1* | 3/2011 | Imamura et al. ............... 345/211 |
| 2011/0169018 | A1* | 7/2011 | Hsiao et al. ..................... 257/88 |
| 2012/0299000 | A1* | 11/2012 | Choo et al. ..................... 257/59 |
| 2014/0132584 | A1* | 5/2014 | Kim ............................. 345/212 |

FOREIGN PATENT DOCUMENTS

| | | |
|---|---|---|
| JP | 3918412 B2 | 2/2007 |
| KR | 100611743 B | 8/2006 |
| KR | 100611769 B | 8/2006 |

* cited by examiner

*Primary Examiner* — Michael Jung
(74) *Attorney, Agent, or Firm* — Cantor Colburn LLP

(57) ABSTRACT

A thin film transistor array substrate includes: a driving thin film transistor including an active layer having a bent shape, where the active layer includes: a first active pattern extending substantially in a first direction; and a second active pattern extending substantially in a second direction perpendicular to the first direction and connected to the first active pattern, and a gate electrode disposed on the active layer, where gate electrode overlaps the first active pattern and exposes the second active pattern; and a capacitor including a first electrode defined by the gate electrode of the driving thin film transistor, and a second electrode disposed on the first electrode, where the second electrode overlaps substantially an entire surface of the first electrode.

20 Claims, 9 Drawing Sheets

THIN FILM TRANSISTOR ARRAY SUBSTRATE HAVING NON LINEAR ACTIVE LAYER AND ORGANIC LIGHT EMITTING DISPLAY APPARATUS INCLUDING THE SAME

This application claims priority to Korean Patent Application No. 10-2013-0085696, filed on Jul. 19, 2013, and all the benefits accruing therefrom under 35 U.S.C. §119, the content of which in its entirety is herein incorporated by reference.

BACKGROUND

1. Field

One or more exemplary embodiments of the invention relate a thin film transistor ("TFT") array substrate and an organic light emitting display apparatus including the TFT array.

2. Description of the Related Art

Recently, an organic light emitting display apparatus is widely used as a display apparatus for displaying an image.

The organic light emitting display apparatus typically includes a pixel circuit connected to a plurality of signal lines disposed on a substrate, and an organic light emitting diode ("OLED") connected to the pixel circuit.

Since an active layer that defines a source, a drain and a channel of an amorphous silicon thin film transistor ("a-Si TFT") used in the pixel circuit includes amorphous silicon, the a-Si TFT has low electron mobility lower than or equal to 1 square centimeter per volt second ($cm^2/Vs$). Accordingly, recently, the a-Si TFT is being replaced by a polycrystalline silicon TFT ("poly-Si TFT"). The poly-Si TFT has high electron mobility and excellent stability to light irradiation compared to the a-Si TFT. Thus, the poly-Si TFT may be effectively used as an active layer of a driving and/or switching TFT of the organic light emitting display apparatus.

Poly-Si may be manufactured via any one of various methods. Among the various methods, large panel crystallization may be performed using an excimer laser annealing ("ELA") method.

SUMMARY

One or more exemplary embodiments of the invention provides a thin film transistor array substrate and an organic light emitting display apparatus including the thin film transistor array substrate, where a stain generated in channel region of an active layer on the thin film transistor array substrate during panel crystallization using an excimer laser annealing ("ELA") method is effectively prevented.

Additional aspects will be set forth in part in the description which follows and, in part, will be apparent from the description, or may be learned by practice of the presented embodiments.

According to one or more exemplary embodiments of the invention, a thin film transistor array substrate includes: a driving thin film transistor including: an active layer having a bent shape, where the active layer includes: a first active pattern extending substantially in a first direction; and a second active pattern extending substantially in a second direction perpendicular to the first direction and connected to the first active pattern; and a gate electrode disposed on the active layer, where gate electrode overlaps the first active pattern and exposes the second active pattern; and a capacitor including: a first electrode defined by the gate electrode of the driving thin film transistor; and a second electrode disposed on the first electrode, where the second electrode overlaps substantially an entire surface of the first electrode.

In an exemplary embodiment, a hole may be defined in a region of the gate electrode corresponding to the second active pattern.

In an exemplary embodiment, an opening may be defined in the second electrode of the capacitor.

In an exemplary embodiment, the thin film transistor array substrate may further include: a first insulating film which covers the active layer; a second insulating film which covers the first electrode of the capacitor; and an interlayer insulating film which covers the second electrode of the capacitor.

In an exemplary embodiment, the thin film transistor array substrate may further include a connection wiring disposed on the interlayer insulating film, where the connection wire connects the first electrode of the capacitor and a thin film transistor through a contact hole defined through the second insulating film and the interlayer insulating film in a region corresponding to the opening in the second electrode of the capacitor.

In an exemplary embodiment, the thin film transistor array substrate may further include: a compensation thin film transistor which compensates a threshold voltage of the driving thin film transistor; and an initialization thin film transistor which transmits an initialization voltage to the gate electrode of the driving thin film transistor.

In an exemplary embodiment, a gate electrode of the compensation thin film transistor and a gate electrode of the initialization thin film transistor may be disposed in a same layer as the first electrode of the capacitor.

In an exemplary embodiment, the thin film transistor array substrate may further include a driving voltage line disposed in a same layer as the connection wiring and connected to the second electrode of the capacitor, where the driving voltage line transmits a driving voltage to the second electrode of the capacitor.

In an exemplary embodiment, the active layer may include a crystallized semiconductor material.

According to one or more exemplary embodiments of the invention, a thin film transistor array substrate includes: a driving thin film transistor defined by a plurality of thin film transistors connected in series, where the driving thin film transistor includes: an active layer including: a plurality of channel regions extending substantially in a first direction; and a plurality of nodes extending substantially in a second direction perpendicular to the first direction, where the plurality of nodes connects the plurality of channel regions; and a gate electrode disposed overlapping the plurality of channel regions, where the gate electrode exposes the plurality of nodes; and a capacitor including: a first electrode defined by the gate electrode of the driving thin film transistor; and a second electrode disposed on the first electrode, where the second electrode overlaps the driving thin film transistor.

In an exemplary embodiment, a cut-out may be defined in a region of the gate electrode corresponding to the plurality of nodes, where the cut-out extends from a side of the gate electrode.

In an exemplary embodiment, a hole may be defined in the region of the gate electrode corresponding to the plurality of nodes.

According to one or more exemplary embodiments of the invention, an organic light emitting display apparatus includes: a driving thin film transistor including: an active layer having a bent shape, where the active layer includes: a first active pattern extending substantially in a first direction; and a second active pattern extending substantially in a second direction perpendicular to the first direction and connected to the first active pattern; and a gate electrode disposed on the active layer, where the gate electrode overlaps the active layer and exposes the second active pattern; a capacitor including: a first electrode defined by the gate electrode; and a second electrode disposed on the first electrode, where the second electrode overlaps substantially an entire surface of the first electrode; and an organic light emitting diode which emits light by receiving a driving current from the driving thin film transistor.

In an exemplary embodiment, a hole may be defined in the region of the gate electrode corresponding to the second active pattern.

BRIEF DESCRIPTION OF THE DRAWINGS

These and/or other features will become apparent and more readily appreciated from the following description of the embodiments, taken in conjunction with the accompanying drawings, in which.

DETAILED DESCRIPTION

Figure 1:
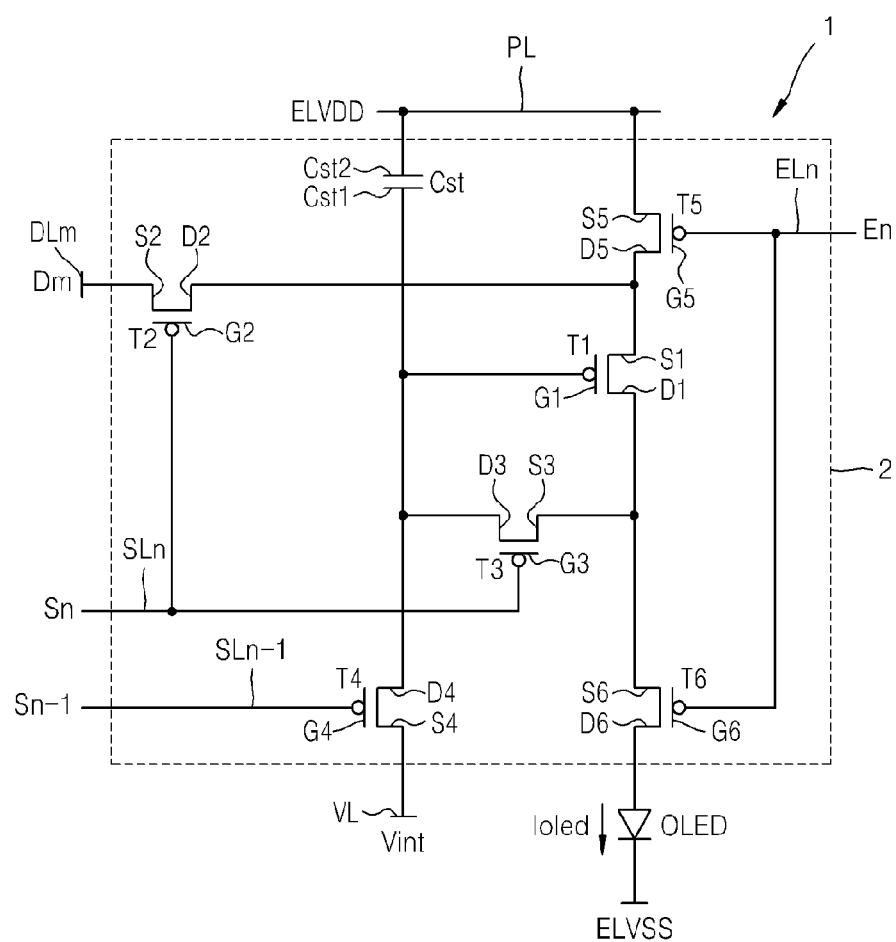
FIG. 1 is an equivalent circuit diagram of a pixel of an exemplary embodiment of an organic light emitting display apparatus, according to the invention.

The invention will be described more fully hereinafter with reference to the accompanying drawings, in which embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer, the element or layer can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to accompanying drawings.

Figure 2:
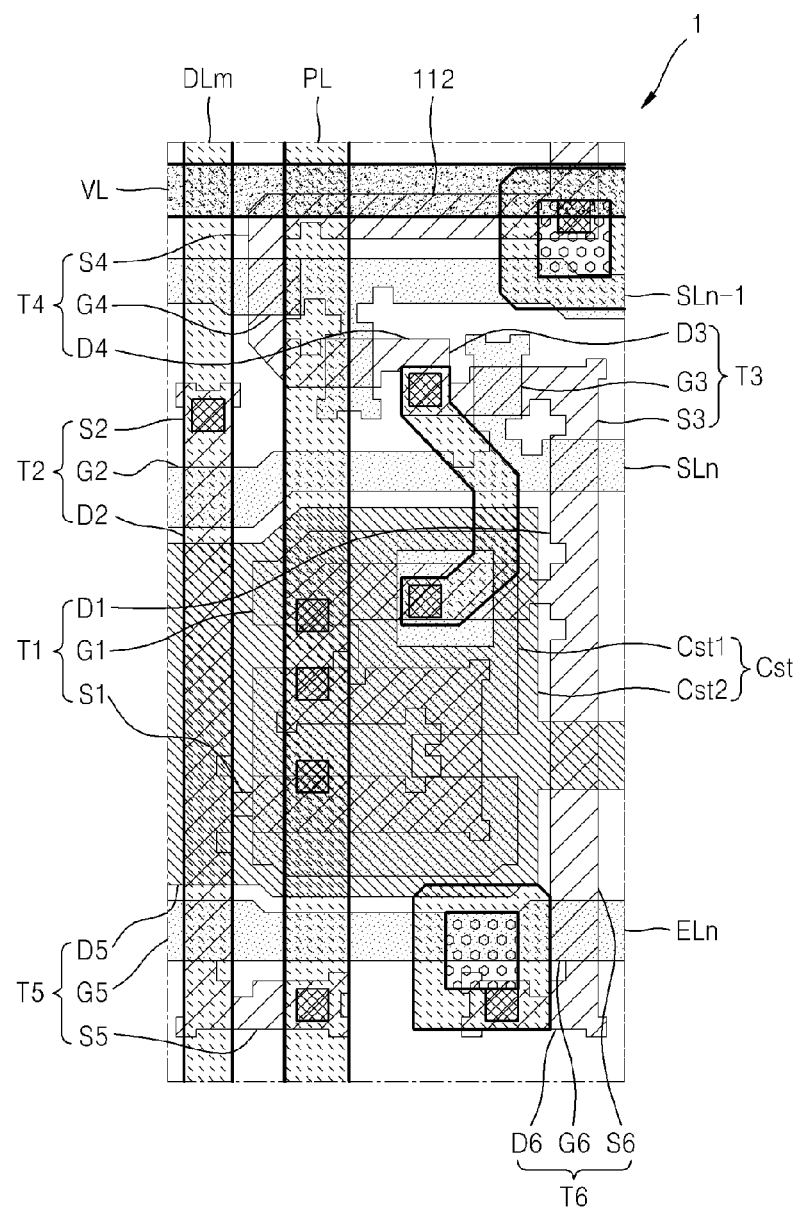
FIG. 2 is a plan view of a pixel circuit of the pixel of FIG. 1.

FIG. 1 is an equivalent circuit diagram of a pixel 1 of an exemplary embodiment of an organic light emitting display apparatus, according to the invention, and FIG. 2 is a plan view of a pixel circuit 2 of the pixel 1 of FIG. 1.

In an exemplary embodiment, the organic light emitting display apparatus includes a plurality of pixels arranged substantially in a matrix form and connected to a plurality of scan lines and a plurality of data lines.

The pixel 1 shown in FIGS. 1 and 2 is one of the pixels arranged in an n-th pixel row, and are connected to a first scan line SLn corresponding to the n-th pixel row and a second scan line SLn-1 corresponding to an (n−1)-th pixel row before the n-th pixel row. In an exemplary embodiment, as shown in FIG. 1, the pixel 1 may be connected to a scan line corresponding to a corresponding pixel row and a scan line of a previous pixel row, but not being limited thereto. In an alternative exemplary embodiment, the pixel 1 may be connected to any two of the scan lines.

In an exemplary embodiment, the pixel 1 of the organic light emitting display apparatus includes the pixel circuit 2 including a plurality of thin film transistors ("TFT"s) and a storage capacitor Cst. In such an embodiment, the pixel 1 further includes an organic light emitting diode OLED that emits light by receiving a driving current through the pixel circuit 2.

In an exemplary embodiment, as shown in FIG. 1, the TFTs of the pixel circuit 2 include a driving TFT T1, a switching TFT T2, a compensation TFT T3, an initialization TFT T4, a first light emission control TFT T5 and a second light emission control TFT T6.

The pixel 1 includes the first scan line SLn for transmitting a first scan signal Sn to the switching TFT T2 and the compensation TFT T3, the second scan line SLn-1 for transmitting a second scan signal Sn-1 constituting a previous scan signal to the initialization TFT T4, a light emission control line ELn for transmitting a light emission control signal En to the first light emission control TFT T5 and the second light emission control TFT T6, a data line DLm for transmitting a data signal Dm, which is crossing the first scan line SLn, a driving voltage line PL for transmitting a first power voltage ELVDD and extending substantially parallel to the data line DLm, and an initialization voltage line VL for transmitting an initialization voltage Vint for initializing the driving TFT T1 and extending substantially parallel to the second scan line SLn-1.

In an exemplary embodiment, as shown in FIG. 2, the driving TFT T1, the switching TFT T2, the compensation TFT T3, the initialization TFT T4, the first light emission control TFT T5 and the second light emission control TFT T6 are disposed along an active layer 112, where the active layer 112 is bent in any one of various shapes. The active layer 112 includes polysilicon, and includes a channel region on which an impurity is not doped, and source and drain regions provided by doping impurities on both sides of the channel region. In such an embodiment, the impurities may be determined based on a type of TFT. In an exemplary embodiment, the impurities may be an N-type impurity or a P-type impurity, for example.

In an exemplary embodiment, as shown in FIGS. 1 and 2, a gate electrode G1 of the driving TFT T1 is connected to a first electrode Cst1 of the storage capacitor Cst. A source electrode S1 of the driving TFT T1 is connected to the driving voltage line PL through the first light emission control TFT T5. A drain electrode D1 of the driving TFT T1 is electrically connected to an anode of the organic light emitting diode OLED through the second light emission control TFT T6. The driving TFT T1 receives the data signal Dm based on a switching operation of the switching TFT T2, and supplies a driving current Ioled to the organic light emitting diode OLED.

In such an embodiment, a gate electrode G2 of the switching TFT T2 is connected to the first scan line SLn. A source electrode S2 of the switching TFT T2 is connected to the data line DLm. A drain electrode D2 of the switching TFT T2 is connected to the source electrode S1 of the driving TFT T1 and is connected to the driving voltage line PL through the first light emission control TFT T5. The switching TFT T2 is turned on based on the first scan signal Sn received through the first scan line SLn, and performs a switching operation for transmitting the data signal Dm transmitted to the data line DLm to the source electrode S1 of the driving TFT T1.

In such an embodiment, a gate electrode G3 of the compensation TFT T3 is connected to the first scan line SLn. A source electrode S3 of the compensation TFT T3 is connected to the drain electrode D1 of the driving TFT T1, and is connected to the anode of the organic light emitting diode OLED through the second light emission control TFT T6. A drain electrode D3 of the compensation TFT T3 is connected to the first electrode Cst1 of the storage capacitor Cst, a drain electrode D4 of the initialization TFT T4 and the gate electrode G1 of the driving TFT T1. The compensation TFT T3 is turned on based on the first scan signal Sn received through the first scan line SLn, and diode-connects the driving TFT by connecting the gate electrode G1 and the drain electrode D1 of the driving TFT T1.

In such an embodiment, a gate electrode G4 of the initialization TFT T4 is connected to the second scan line SLn-1. A source electrode S4 of the initialization TFT T4 is connected to the initialization voltage line VL. The drain electrode D4 of the initialization TFT T4 is connected to the first electrode Cst1 of the storage capacitor Cst, the drain electrode D3 of the compensation TFT T3 and the gate electrode G1 of the driving TFT T1. The initialization TFT T4 is turned on based on the second scan signal Sn-1 received through the second scan line SLn-1, and performs an initialization operation for initializing a voltage of the gate electrode G1 of the driving TFT T1 by transmitting the initialization voltage Vint to the gate electrode G1 of the driving TFT T1.

In such an embodiment, a gate electrode G5 of the fifth light emission control TFT T5 is connected to the light emission control line ELn. A source electrode S5 of the first light emission control TFT T5 is connected to a driving voltage line PL. A drain electrode D5 of the first light emission control TFT T5 is connected to the source electrode S1 of the driving TFT T1 and the drain electrode D2 of the switching TFT T2.

In such an embodiment, a gate electrode G6 of the second light emission control TFT T6 is connected to the light emission control line ELn. A source electrode S6 of the second light emission control TFT T6 is connected to the drain electrode D1 of the driving TFT T1 and the source electrode S3 of the compensation TFT T3. A drain electrode D6 of the second light emission control TFT T6 is electrically connected to the anode of the organic light emitting diode OLED. The first light emission control TFT T5 and the second light emission control TFT T6 are simultaneously turned on based on the light emission control signal En received through the light emission control line ELn, and thus the first power voltage ELVDD is transmitted to the organic light emitting diode OLED such that the driving current Ioled flows through the organic light emitting diode OLED.

In such an embodiment, a second electrode Cst2 of the storage capacitor Cst is connected to the driving voltage line PL. The first electrode Cst1 of the storage capacitor Cst is connected to the gate electrode G1 of the driving TFT T1, the drain electrode D3 of the compensation TFT T3 and the drain electrode D4 of the initialization TFT T4.

In such an embodiment, a cathode of the organic light emitting diode OLED is connected to a second power voltage ELVSS source. The organic light emitting diode OLED displays an image by emitting light upon receiving the driving current Ioled from the driving TFT T1. The first power voltage ELVDD may be a high level voltage, and the second power voltage ELVSS may be a voltage lower than the first power voltage ELVDD or may be a ground voltage.

Operations of the pixel 1 of an exemplary embodiment of the organic light emitting display apparatus, according to the invention, will now be described in detail.

In an exemplary embodiment, the second scan signal Sn-1 at a low level is supplied through the second scan line SLn-1 during an initialization period. Then, the initialization TFT T4 is turned on by the second scan signal Sn-1 at the low level, the initialization voltage Vint is transferred to the gate electrode G1 of the driving TFT T1 from the initialization voltage line VL through the initialization TFT T4, and the driving TFT T1 is initialized by the initialization voltage Vint.

In an exemplary embodiment, the first scan signal Sn at a low level is supplied through the first scan line SLn during a data programming period. Accordingly, the switching TFT T2 and the compensation TFT T3 are turned on by the first scan signal Sn at the low level.

In such an embodiment, the driving TFT T1 is diode-connected by the turned-on compensation TFT T3, and is biased in a forward direction.

Accordingly, a compensation voltage (Dm+Vth) obtained by adding a threshold voltage (Vth) of the driving TFT T1 to the data signal Dm supplied from the data line DLm is applied to the gate electrode G1 of the driving TFT T1. In such an embodiment, Vth may be a negative value.

The first power voltage ELVDD and the compensation voltage (Dm+Vth) are respectively applied to two ends (e.g., the first and second electrodes Cts1 and Cst2) of the storage capacitor Cst, and a charge corresponding to a difference between the first power voltage ELVDD and the compensation voltage (Dm+Vth) is stored in the storage capacitor Cst. Then, the light emission control signal En supplied from the light emission control line ELn is changed from a high level to a low level. Accordingly, the first light emission control TFT T5 and the second light emission control TFT T6 are turned on by the light emission control signal En at the low level during a light emission period.

Then, the driving current Ioled is generated based on a voltage difference between a voltage of the gate electrode G1 of the driving TFT T1 and the first power voltage ELVDD, and is supplied to the organic light emitting diode OLED through the second light emission control TFT T6. A gate-source voltage (Vgs) of the driving TFT T1 is maintained at a voltage of (Dm+Vth)−ELVDD by the storage capacitor Cst during the light emission period, and the driving current Ioled is substantially proportional to a voltage of $(Dm-ELVDD)^2$, i.e., a square of a voltage obtained by subtracting the threshold voltage Vth from the source-gate voltage (Vgs), corresponding to a current-voltage relation of the driving TFT T1. Accordingly, the driving current Ioled is determined independently of the threshold voltage (Vth) of the driving TFT T1.

FIGS. 3 through 6 are plan views showing an exemplary embodiment of a method of forming the pixel circuit of the pixel 1 of FIGS. 1 and 2.

Figure 3:
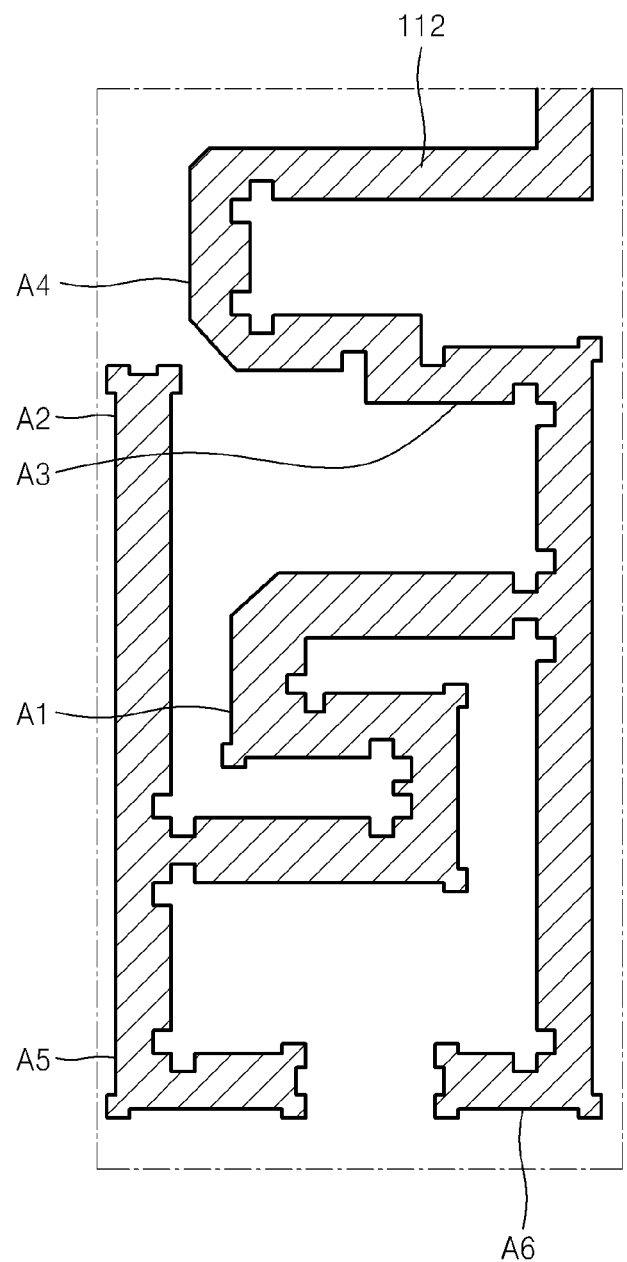
FIGS. 3 through 6 are plan views showing an exemplary embodiment of a method of forming the pixel circuit of the pixel of FIGS. 1 and 2.

Referring to FIG. 3, the active layer 112 of the pixel 1 is provided, e.g., formed, on a substrate. The active layer 112 may be formed by depositing a semiconductor layer on the substrate, and patterning and crystallizing the semiconductor layer along an active layer pattern. In an exemplary embodiment, the semiconductor layer may be first patterned and then crystallized, or vice versa. Crystallization may be performed via any one of various methods, such as a rapid thermal annealing ("RTA") method, a solid phase crystallization ("SPC") method, an excimer laser annealing ("ELA") method, a metal induced crystallization ("MIC") method, a metal induced lateral crystallization ("MILC") method, a sequential lateral solidification ("SLS") method, and an advanced sequential lateral solidification ("ASLS") method, for example.

In an alternative exemplary embodiment, a buffer layer (not shown) may be further provided on the substrate before providing the active layer 112.

A TFT of the pixel circuit 2 is formed along the active layer 112. In an exemplary embodiment, active layers A1 through A6 of the driving TFT T1, the switching TFT T2, the compensation TFT T3, the initialization TFT T4, the first light emission control TFT T5 and the second light emission control TFT T6 are provided on the active layer 112.

The active layer 112 may have a bent structure including in any one of various shapes. In an exemplary embodiment, the active layer A1 of the driving TFT T1 may be a plurality of bent portions in an 'S' shape. In an alternative exemplary embodiment, the active layer A1 of the driving TFT T1 may have a plurality of bent portions in a '≡' shape, 'M' shape, 'W' shape or a zigzag shape.

According to an exemplary embodiment of the invention, by providing the active layer A1 of the driving TFT T1 to have a bent structure, instead of providing the active layer A1 in a straight line, a length of the active layer A1 provided in a predetermined space may be increased. In such an embodiment, a channel region of the active layer A1 may be long, such that a driving range of a gate voltage applied to the gate electrode G1 may be wide. In such an embodiment, where the driving range of the gate voltage is wide, a grayscale of light emitted from the organic light emitting diode OLED may be further precisely controlled by changing a size of the gate voltage, thereby increasing resolution and display quality of the organic light emitting display apparatus.

A first gate insulating film is provided, e.g., formed, on the substrate where the active layer 112 is provided. The first gate insulating film may include an organic insulating material or an inorganic insulating material, or may have a multilayer structure in which an organic insulating material and an inorganic insulating material are alternately stacked on each other.

Figure 4:
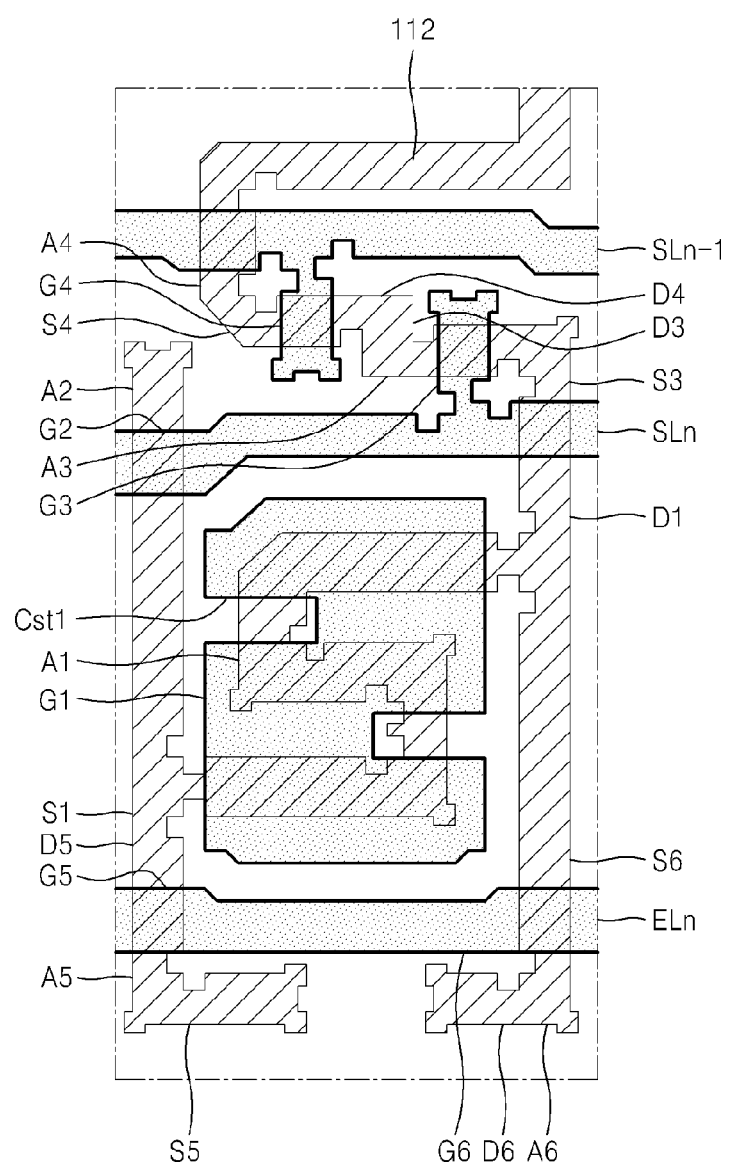

Referring to FIG. 4, a first gate conductive layer is provided, e.g., formed, on the first gate insulating film. The first gate conductive layer includes the first scan line SLn, the second scan line SLn-1, the light emission control line ELn and the first electrode Cst1 of the storage capacitor Cst. The first gate conductive layer may include a low resistance metal material, such as aluminum (Al) or copper (Cu), for example.

A portion of the first scan line SLn operates as the gate electrode G2 of the switching TFT T2, and a portion protruding and extending from the first scan line SLn operates as the gate electrode G3 of the compensation TFT T3. A portion protruding and extending from the second scan line SLn-1 operates as the gate electrode G4 of the initialization TFT T4. A portion of the light emission control line ELn operates as the gate electrode G6 of the second light emission control TFT T6 and the gate electrode G5 of the first light emission control TFT T5.

The first electrode Cst1 of the storage capacitor Cst operates as the gate electrode G1 of the driving TFT T1. The first electrode Cst1 of the storage capacitor Cst is separated from the first scan line SLn, the second scan line SLn-1 and the light emission control line ELn, and overlaps the channel region of the active layer A1 of the driving TFT T1 in a form of a floating electrode. The first electrode Cst1 of the storage capacitor Cst has substantially a rectangular shape from which a region corresponding to an active pattern of a vertical component is cut-out or removed from the active layer A1 of the driving TFT T1. Accordingly, in such an embodiment, a cut-out is defined (e.g., formed) in the first electrode Cst1 of the storage capacitor Cst.

In an exemplary embodiment, a second gate insulating film is provided, e.g., formed, on the substrate where the first gate conductive layer is provided. The second gate insulating film operates as a dielectric material of the storage capacitor Cst. The second gate insulating film may include an organic insulating material or an inorganic insulating material, or may have a multilayer structure in which an organic insulating material and an inorganic insulating material are alternately stacked on each other.

Then, the active layer 112 on the substrate, where the first gate conductive layer is provided, is doped with an impurity such that a channel region is provided on a portion of the active layers A1 through A6, where the impurity is not doped, and source and drain regions are provided on both sides of the channel region in the active layers A1 through A6, where the impurity is doped. In such an embodiment, the impurity may be determined based on a type of a TFT. In such an embodiment, the impurity may be an N-type or P-type impurity.

The source and drain regions where the active layer A1 of the driving TFT T1 is doped with the impurity correspond to the source electrode S1 and the drain electrode D1, respectively. The source and drain regions where the active layer A2 of the switching TFT T2 is doped with the impurity correspond to the source electrode S2 and the drain electrode D2, respectively. The source and drain regions where the active layer A3 of the compensation TFT T3 is doped with the impurity correspond to the source electrode S3 and the drain electrode D3, respectively. The source and drain regions where the active layer A4 of the initialization TFT T4 is doped with the impurity correspond to the source electrode S4 and the drain electrode D4, respectively. The source and drain regions where the active layer A5 of the first light emission control TFT T5 is doped with the impurity is doped correspond to the source electrode S5 and the drain electrode D5, respectively. The source and drain regions where the active layer A6 of the second light emission control TFT T6 is doped with the impurity correspond to the source electrode S6 and the drain electrode D6, respectively.

Figure 5:
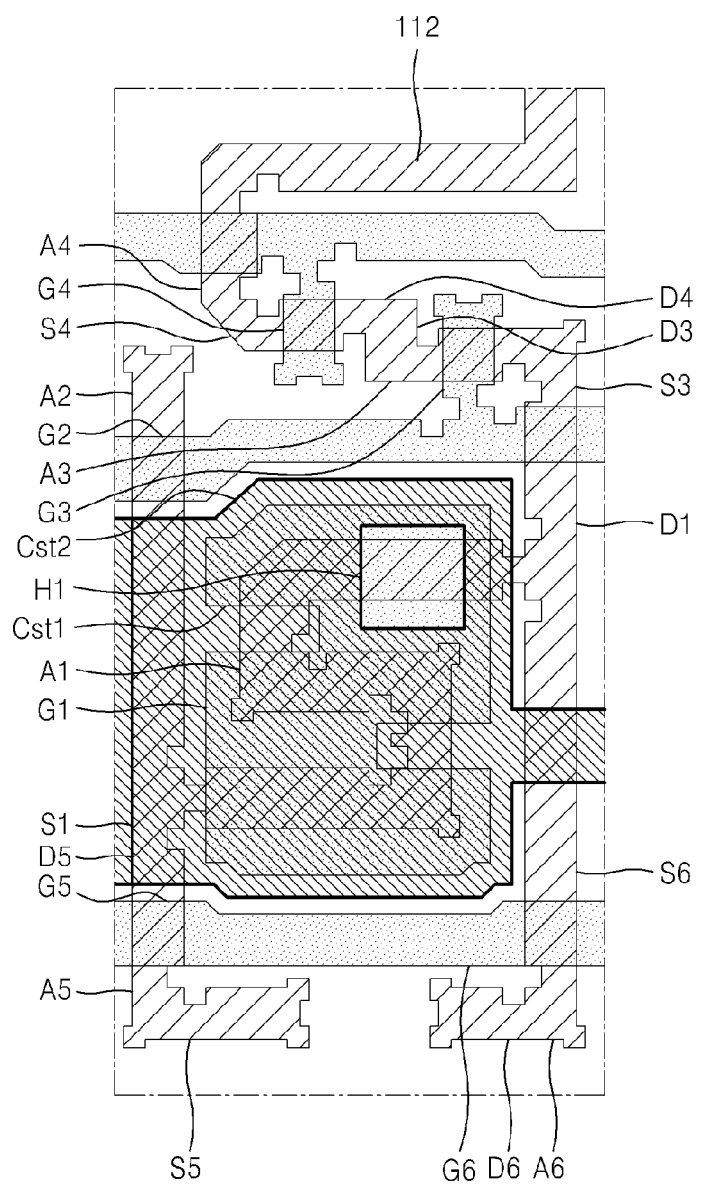

Referring to FIG. 5, a second gate conductive layer is provided, e.g., formed, on the second gate insulating film. The second gate conductive layer may include the second electrode Cst2 of the storage capacitor Cst. In such an embodiment, the second gate conductive layer may include a low resistance metal material, such as Al or Cu, for example.

In such an embodiment, the second electrode Cst2 is provided to overlap the entire first electrode Cst1, thereby providing the storage capacitor Cst. Accordingly, the storage capacitor Cst perpendicularly overlaps the driving TFT T1, that is, overlaps when viewed from a top view. In such an embodiment, the storage capacitor Cst is provided to overlap the active layer A1 of the driving TFT T1 to obtain a space for the storage capacitor Cst, which is reduced by the active layer A1 of the driving TFT T1, which has a bent shape, such that storage capacitance in high resolution may be provided. The second electrode Cst2 of the storage capacitor Cst may have a mesh structure as adjacent pixels in horizontal and vertical directions are connected to each other. A first opening H1 may be formed in a portion of the second electrode Cst2 of the storage capacitor Cst. The first opening H1 overlaps the first electrode Cst1 of the storage capacitor Cst.

An overlay deviation between the first and second electrodes Cst1 and Cst2 of the storage capacitor Cst may occur during a manufacturing process of the organic light emitting display apparatus. Here, when two or more layers are provided to overlap each other, and each layer is shifted in a top, bottom, left or right direction, an overlapping region differs from a predetermined overlapping region that is initially designed, and the overlay deviation means a difference between such overlapping regions. The overlay deviation may occur due to misalignment between a substrate and a mask or between a substrate and a stepper while providing a conductive layer throughout the substrate and patterning the conductive layer via a photolithography process. Such an overlay deviation may be generated within an error range of a process apparatus in a system that simultaneously manufactures a massive amount of large panels. When an overlay deviation is generated in the first and second electrodes Cst1 and Cst2 of the storage capacitor Cst, capacitance is different from a predetermined value that is initially designed. When the capacitance is different from the predetermined value, a low grayscale stain or color distortion may occur, and the quality of the organic light emitting display apparatus may be substantially deteriorated.

According to an exemplary embodiment of the invention, when the first opening H1 is formed in the second electrode Cst2 of the storage capacitor Cst, the second electrode Cst2 overlaps the entire first electrode Cst1, and thus even when an overlay deviation is generated in the first and second electrodes Cst1 and Cst2, the capacitance may be maintained substantially constant.

Next, an interlayer insulating film is provided, e.g., formed, on the substrate where the second gate conductive layer is provided. In such an embodiment, the interlayer insulating film may include an organic insulating material or an inorganic insulating material, or may have a multilayer structure in which an organic insulating material and an inorganic insulating material are alternately stacked on each other.

Figure 6:
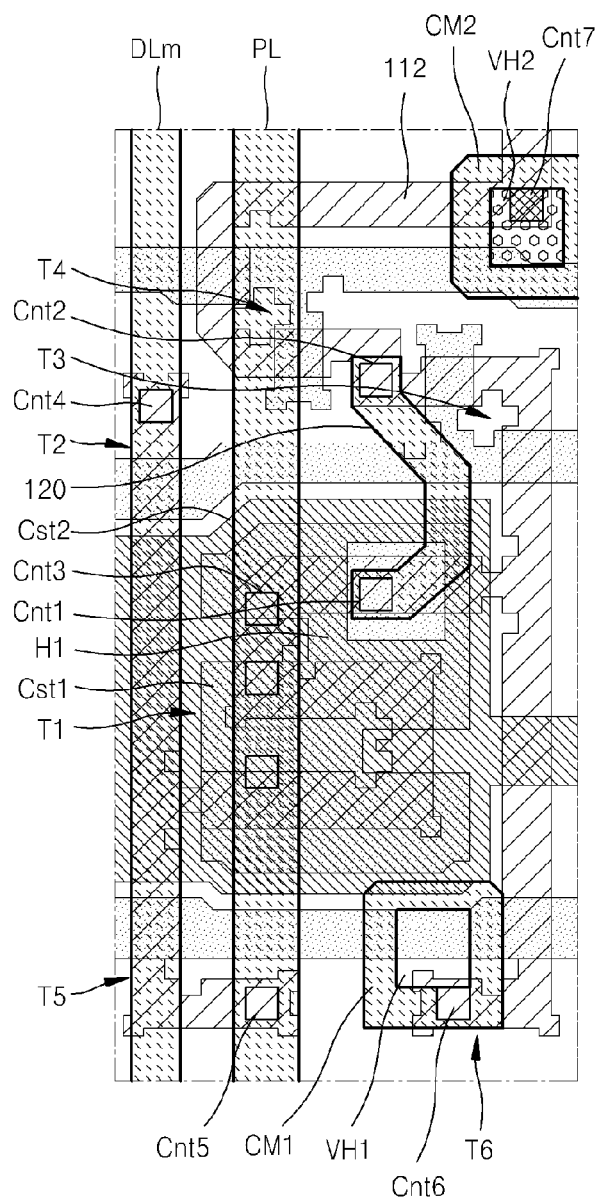

Referring to FIG. 6, a data line DL, the driving voltage line PL, a connection wiring 120 that connects a first contact hole Cnt1 and a second contact hole Cnt2, and first and second cover metals CM1 and CM2 that cover sixth and seventh contact holes Cnt6 and Cnt7, respectively, are provided on the substrate where the interlayer insulating film is provided.

The data line DL is provided, e.g., disposed, substantially in a horizontal direction on the left or right side of a pixel. The data line DL is connected to the switching TFT T2 through a fourth contact hole Cnt4 exposing the source region of the switching TFT T2 by being formed through the first gate insulating film, the second gate insulating film and the interlayer insulating film.

The driving voltage line PL is adjacently provided, e.g., disposed, to the data line DL substantially in the horizontal direction on the left or right side of the pixel. The driving voltage line PL is connected to the second electrode Cst2 of the storage capacitor Cst through a third contact hole Cnt3 exposing a part of the second electrode Cst2 by being formed through the interlayer insulating film. Also, the driving voltage line PL is connected to the first light emission control TFT T5 through a fifth contact hole Cnt5 exposing the source region of the first light emission control TFT T5 by being formed through the first gate insulating film, the second gate insulating film and the interlayer insulating film.

The connection wiring 120 connects the first electrode Cst1 of the storage capacitor Cst to the compensation TFT T3 and the initialization TFT T4. The connection wiring 120 penetrates through the first opening H1 of the second electrode Cst2 of the storage capacitor Cst, and connects the first contact hole Cnt1 exposing the part of the first electrode Cst1 of the storage capacitor Cst by being formed through the second gate insulating film and the interlayer insulating film and the second contact hole Cnt2 exposing the drain regions of the compensation TFT T3 and initialization TFT T4 by being formed through the first gate insulating film, the second gate insulating film and the interlayer insulating film.

The first cover metal CM1 contacts the sixth contact hole Cnt6 exposing the drain region of the second light emission control TFT T6 by being formed in the first gate insulating film, the second gate insulating film, and the interlayer insulating film. The second cover metal CM2 contacts the seventh contact hole Cnt7 exposing the source region of the initialization TFT T4 by being formed in the first gate insulating film, the second gate insulating film and the interlayer insulating film.

The data line DL, the driving voltage line PL, the connection wiring 120, and the first and second cover metals CM1 and CM2 may be provide, e.g., formed, on the same layer and using a same material as each other.

Next, a protection film covering the data line DL, the driving voltage line PL, the connection wiring 120, and the first and second cover metals CM1 and CM2 is provided, e.g., formed, on the interlayer insulating film. First and second via holes VH1 and VH2 exposing portions of the first and second cover metals CM1 and CM2, respectively, are formed through the protection film.

Although not shown in FIG. 6, in such an embodiment, a pixel electrode of the organic light emitting diode OLED is provided while covering the first via hole VH1 to be connected to the second light emission control TFT T6. In such an embodiment, the initialization voltage line VL is provided, e.g., formed, substantially parallel to the first and second scan lines SLn and SLn-1 while covering the second via hole VH2 to be connected to the initialization TFT T4.

A pixel defining film is provided, e.g., formed, on an edge of the pixel electrode and on the protection film, and a pixel opening exposing the pixel electrode is formed in the pixel defining film. The pixel defining film may include of an organic material, such as polyacrylates resin or polyimides, or a silica-based inorganic material, for example. An organic emission layer is provide, e.g., formed, on the pixel electrode exposed by the pixel opening, and a common electrode is formed on the organic emission layer throughout the substrate. As such, the organic light emitting diode OLED including the pixel electrode, the organic emission layer and the common electrode is provided, e.g., formed.

In an exemplary embodiment, the pixel electrode may be an anode that is a hole injection electrode, and the common electrode may be a cathode that is an electron injection electrode, but not being limited thereto. In an alternative exemplary embodiment, the pixel electrode may be a cathode, and the common electrode may be an anode based on a method of driving an organic light emitting display apparatus. Holes and electrons are injected into the organic emission layer respectively from the pixel electrode and the common electrode, and light is emitted when excitons that are generated when the holes and electrons combine with each other are changed from an excited state to a ground state.

The organic emission layer may include a low molecular organic material or a high molecular organic material, such as poly(3,4-ethylenedioxythiophene) ("PEDOT"). The organic emission layer may have a multilayer including an emission layer and at least one of a hole injection layer ("HIL"), a hole transport layer ("HTL"), an electron transport layer ("ETL") and an electron injection layer ("EIL"). In an exemplary embodiment, where the organic emission layer includes the emission layer, HIL, HTL, ETL and EIL, the HIL is disposed on the pixel electrode, and the HTL, the emission layer, the ETL and the EIL are sequentially disposed, e.g., stacked, on the HIL. In an exemplary embodiment, where the common electrode includes a reflective conductive material, the organic light emitting display apparatus is a bottom emission type. In such an embodiment, the reflective conductive material may include lithium (Li), calcium (Ca), lithium fluoride/calcium (LiF/Ca), lithium fluoride/aluminum (LiF/Al), Al, silver (Ag), magnesium (Mg), gold (Au) or a combination thereof.

Figure 7A:
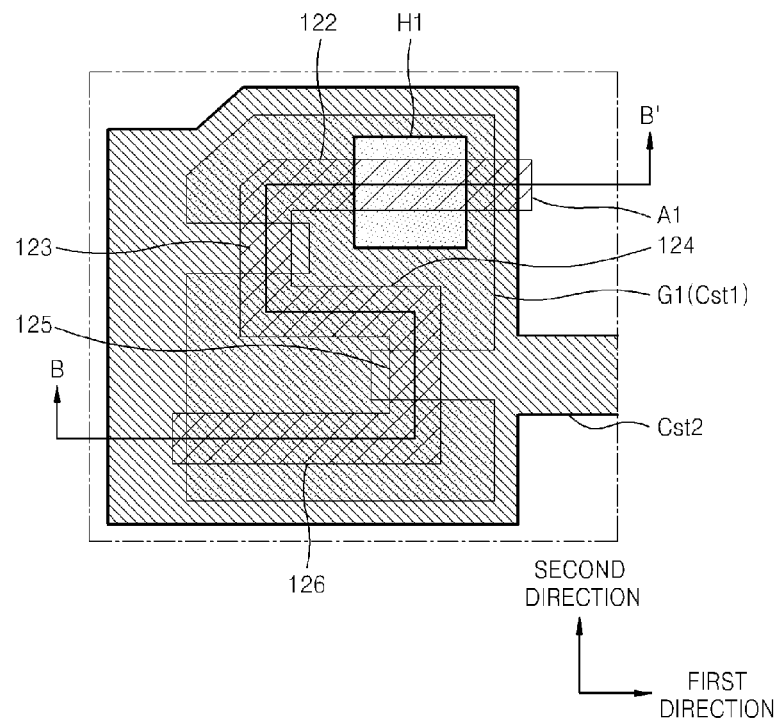
FIG. 7A is a plan view of an exemplary embodiment of a driving thin film transistor ("TFT") and a storage capacitor, according to the invention.
Figure 7B:
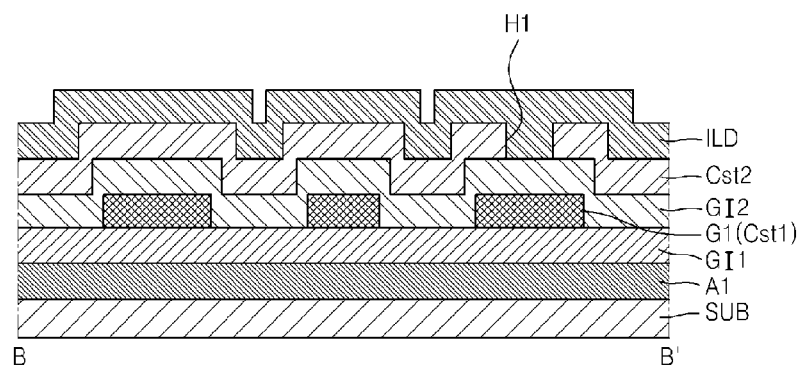
FIG. 7B is a cross-sectional view taken along line B-B' of FIG. 7A.

FIG. 7A is a plan view of an exemplary embodiment of the driving TFT T1 and the storage capacitor Cst, according to the invention, and FIG. 7B is a cross-sectional view taken along line B-B' of FIG. 7A.

Referring to FIGS. 7A and 7B, the active layer A1 of the driving TFT T1 is formed in a bent shape that is an 'S' shape on a substrate SUB, in an exemplary embodiment according to the invention. The active layer A1 includes a plurality of horizontal components 122, 124 and 126 extending substantially in a first direction, and a plurality of vertical components 123 and 125 extending substantially in a second direction. The vertical components 123 and 125 connect the horizontal components 122, 124 and 126.

A first gate insulating film GI1 is provided, e.g., formed, on the active layer A1 on the substrate SUB, and the gate electrode G1 of the driving TFT T1 that also operates as the first electrode Cst1 of the storage capacitor Cst is provided, e.g., formed, on the first gate insulating film GI1. Regions of the gate electrode G1 of the driving TFT T1 corresponding to the vertical components 123 and 125 of the active layer A1 are removed, and thus the gate electrode G1 overlaps the horizontal components 122, 124 and 126 and does not overlap the vertical components 123 and 125. Accordingly, the horizontal components 122, 124 and 126 operate as channel regions, and the vertical components 123 and 125 operate as nodes connecting the channel regions. The vertical components 123 and 125 are doped with an impurity along with source and drain regions while doping the impurity on the active layer A1.

A second gate insulating film GI2 is provided, e.g., formed, on the gate electrode G1 of the driving TFT T1, and the second electrode Cst2 of the storage capacitor Cst is provided, e.g., formed, on the second gate insulating film GI2. Accordingly, the driving TFT T1 and the storage capacitor Cst substantially perpendicularly overlap each other. In such an embodiment, an interlayer insulating film ILD is provided, e.g., formed, on the second electrode Cst2 of the storage capacitor Cst.

Figure 8:
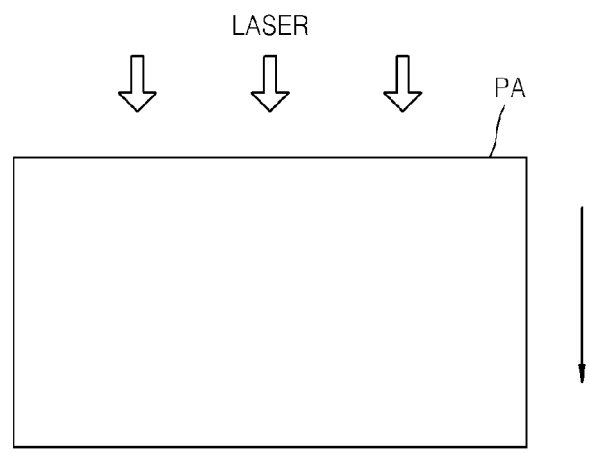
FIG. 8 is a diagram showing a crystallization of a semiconductor layer in an exemplary embodiment of the driving TFT via an excimer laser annealing ("ELA") method, according to the invention.

FIG. 8 is a diagram showing a crystallization of a semiconductor layer in an exemplary embodiment of the driving TFT via an ELA method, according to the invention.

When a semiconductor layer on a large panel is crystallized via the ELA method, a laser divides a panel PA into regions and irradiates a laser beam to each region of the panel PA by scanning the semiconductor layer in a direction indicated by an arrow with a scanning speed from one side of the panel PA, as shown in FIG. 8. Since the laser beam is locally irradiated on the regions of the panel PA, there may be a region where a first shot of the laser beam is not irradiated. Also, shots of the laser beam overlap and crystallize the semiconductor layer as the laser or the panel PA moves by a predetermined distance (e.g., a pitch width). Accordingly, a characteristic distribution of the semiconductor layer may be periodically generated on the panel PA, thereby generating a periodic characteristic distribution of a TFT. Thus, an image having a stain in periodic diagonal line shapes may be displayed.

In an exemplary embodiment, the driving TFT T1 includes the active layer A1 having the horizontal components 122, 124 and 126 (e.g., the components in the first direction) and the vertical component 123 and 125 (e.g., the components in the second direction). In general, the vertical components 123 and 125 of the active layer A1 mainly cause the characteristic distribution of the driving TFT T1 during crystallization of the semiconductor layer due to overlapping of the shots of the laser beam. Accordingly, a stain caused by the ELA may be effectively prevented when a ratio of vertical components to horizontal components is low in the active layer A1 of the driving TFT T1.

In an exemplary embodiment, the gate electrode G1 is not provided in regions corresponding to the vertical components 123 and 125 of the active layer A1 of the driving TFT T1, such that the horizontal components 122, 124 and 126 operate as channel regions and the vertical components 123 and 125 operate as nodes connecting the channel regions. Accordingly, in such an embodiment, a stain caused by ELA may be effectively prevented.

The switching TFT T2 may be a transistor that performs a quick switching operation, and the driving TFT T1 may be a transistor that has a wide driving range of a gate voltage. In an exemplary embodiment, lengths of channel regions are long and a node is formed between the channel regions, such that the driving TFT T1 has an increased delay, and a driving range of a gate voltage applied to the gate electrode G1 is thereby increased. Accordingly, in such an embodiment, thus a grayscale of light emitted from the organic light emitting diode OLED may be further precisely controlled.

In such an embodiment, only the regions of the gate electrode G1 corresponding to the vertical components 123 and 125 of the active layer A1 are removed, such that a capacitance loss of the storage capacitor Cst substantially perpendicularly overlapping the driving TFT T1 may be substantially reduced.

Figure 7C:
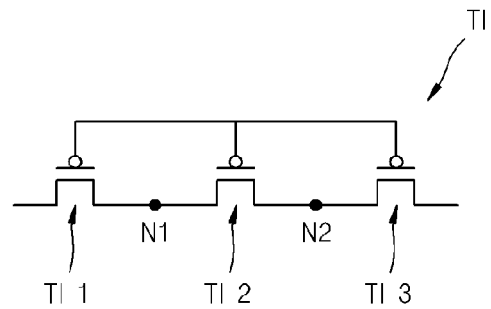
FIG. 7C is an equivalent circuit diagram of the driving TFT of FIG. 7A.

FIG. 7C is an equivalent circuit diagram of the driving TFT T1 of FIG. 7A.

Referring to FIG. 7C, in an exemplary embodiment, where the gate electrode G1 is removed from the vertical components 123 and 125 of the active layer A1, the driving TFT T1 includes a plurality of TFTs T1_1, T1_2 and T1_3 that are connected in series. The vertical components 123 and 125, that is exposed by the gate electrode G1, define nodes N1 and N2 connecting the channel regions. Accordingly, the driving TFT T1 has a structure in which the TFTs T1_1, T1_2 and T1_3 in the number equal to the number of the horizontal components 122, 124 and 126 of the active layer A1 are connected in series by the nodes N1 and N2. In such an embodiment, by reducing the channel regions of the vertical components 123 and 125 of the active layer A1 of the driving TFT T1, characteristic deviation of the driving TFT T1 caused by the crystallization by the ELA may be substantially reduced.

Figure 9:
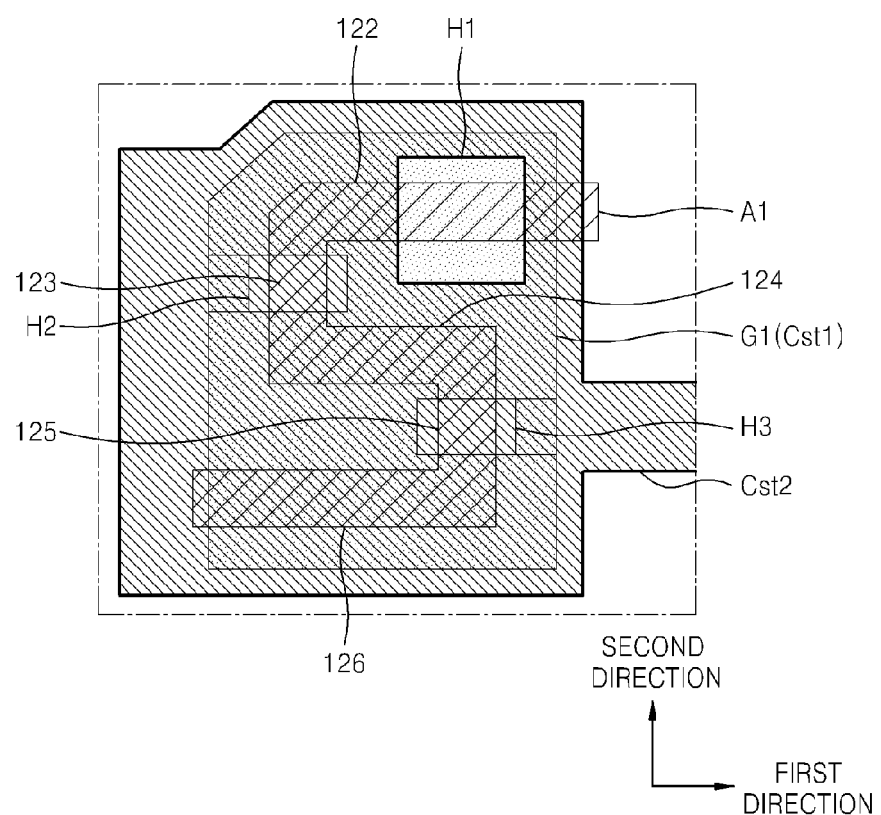
FIG. 9 is a plan view of an alternative exemplary embodiment of a driving TFT and a storage capacitor, according to the invention.

FIG. 9 is a plan view of an alternative exemplary embodiment of the driving TFT T1 and the storage capacitor Cst, according to the invention.

The driving TFT T1 and the storage capacitor Cst of FIG. 9 are substantially the same as the driving TFT T1 and the storage capacitor Cst of FIG. 7A except for the portions of the gate electrode G1 and first electrode Cst1 that expose the actively layer A1 of the driving TFT T1.

As shown in FIG. 9, in an exemplary embodiment, a second opening H2 and a third opening H3 are respectively formed in regions of the gate electrode G1 corresponding to the vertical components 123 and 125 of the active layer A1. In an alternative exemplary embodiment, as shown in FIG. 7A, the regions corresponding to the vertical components 123 and 125 of the active layer A1 are removed from an outer region of the gate electrode G1. In an exemplary embodiment shown in FIG. 9, the regions to be removed from the gate electrode G1 may be reduced by removing portions of the gate electrode G1 to define a hole.

In such an embodiment shown in FIG. 9, a stain caused by the ELA may effectively be prevented by exposing the vertical components 123 and 125 of the active layer A1, and a capacitance loss of the storage capacitor Cst substantially perpendicularly overlapping the driving TFT T1 may be substantially minimized by reducing the area of the portion that expose the actively layer A1 of the driving TFT T1.

In an exemplary embodiment, as shown in FIG. 1, the organic light emitting display apparatus may be a six transistor-one capacitor ("6Tr-1 Cap") structure active matrix (AM) type organic light emitting display apparatus that includes six TFTs and one capacitor per pixel, but the invention is not limited thereto. Accordingly, a display apparatus may include a plurality of TFTs and at least one capacitor per pixel, and may have any one of various structures. In one alternative exemplary embodiment, for example, a separate wiring may be further provided or an existing wiring may be omitted.

As described herein, exemplary embodiments of an organic light emitting display apparatus may obtain a driving range of a driving TFT, may have a reduced capacitance loss, and a stain caused by the ELA may be effectively prevented.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A thin film transistor array substrate comprising:
   a driving thin film transistor comprising:
      an active layer having a bent shape, wherein the active layer comprises:
         a first active pattern extending substantially in a first direction; and
         a second active pattern extending substantially in a second direction perpendicular to the first direction and connected to the first active pattern; and
      a gate electrode disposed on the active layer, wherein gate electrode overlaps the first active pattern and exposes the second active pattern; and
   a capacitor comprising:
      a first electrode defined by the gate electrode of the driving thin film transistor; and
      a second electrode disposed on the first electrode, wherein the second electrode overlaps substantially an entire surface of the first electrode.

2. The thin film transistor array substrate of claim 1, wherein
   a hole is defined in a region of the gate electrode corresponding to the second active pattern.

3. The thin film transistor array substrate of claim 1, wherein an opening is defined in the second electrode of the capacitor.

4. The thin film transistor array substrate of claim 3, further comprising:
a first insulating film which covers the active layer;
a second insulating film which covers the first electrode of the capacitor; and
an interlayer insulating film which covers the second electrode of the capacitor.

5. The thin film transistor array substrate of claim 4, further comprising:
a connection wiring disposed on the interlayer insulating film, wherein the connection wire connects the first electrode of the capacitor and a thin film transistor through a contact hole defined through the second insulating film and the interlayer insulating film in a region corresponding to the opening in the second electrode of the capacitor.

6. The thin film transistor array substrate of claim 5, further comprises:
a compensation thin film transistor which compensates a threshold voltage of the driving thin film transistor; and
an initialization thin film transistor which transmits an initialization voltage to the gate electrode of the driving thin film transistor.

7. The thin film transistor array substrate of claim 6, wherein
a gate electrode of the compensation thin film transistor and a gate electrode of the initialization thin film transistor are disposed in a same layer as the first electrode of the capacitor.

8. The thin film transistor array substrate of claim 5, further comprises:
a driving voltage line disposed in a same layer as the connection wiring and connected to the second electrode of the capacitor,
wherein the driving voltage line transmits a driving voltage to the second electrode of the capacitor.

9. The thin film transistor array substrate of claim 1, wherein
the active layer comprises a crystallized semiconductor material.

10. A thin film transistor array substrate comprising:
a driving thin film transistor defined by a plurality of thin film transistors connected in series, wherein the driving thin film transistor comprises:
an active layer comprising:
a plurality of channel regions extending substantially in a first direction; and
a plurality of nodes extending substantially in a second direction perpendicular to the first direction, wherein the plurality of nodes connects the plurality of channel regions; and
a gate electrode disposed overlapping the plurality of channel regions, wherein the gate electrode exposes the plurality of nodes; and
a capacitor comprising:
a first electrode defined by the gate electrode of the driving thin film transistor; and
a second electrode disposed on the first electrode, wherein the second electrode overlaps the driving thin film transistor.

11. The thin film transistor array substrate of claim 10, wherein
a cut-out is defined in a region of the gate electrode corresponding to the plurality of nodes, wherein the cut-out extends from a side of the gate electrode.

12. The thin film transistor array substrate of claim 10, wherein
a hole is defined in the region of the gate electrode corresponding to the plurality of nodes.

13. An organic light emitting display apparatus comprising:
a driving thin film transistor comprising:
an active layer having a bent shape, wherein the active layer comprises:
a first active pattern extending substantially in a first direction; and
a second active pattern extending substantially in a second direction perpendicular to the first direction and connected to the first active pattern; and
a gate electrode disposed on the active layer, wherein the gate electrode overlaps the active layer and exposes the second active pattern;
a capacitor comprising:
a first electrode defined by the gate electrode; and
a second electrode disposed on the first electrode, wherein the second electrode overlaps substantially an entire surface of the first electrode; and
an organic light emitting diode which emits light by receiving a driving current from the driving thin film transistor.

14. The organic light emitting display apparatus of claim 13, wherein a hole is defined in a region of the gate electrode corresponding to the second active pattern.

15. The organic light emitting display apparatus of claim 13, wherein
an opening is defined in the second electrode of the capacitor.

16. The organic light emitting display apparatus of claim 13, further comprising:
a first insulating film which covers the active layer;
a second insulating film which covers the first electrode of the capacitor; and
an interlayer insulating film which covers the second electrode of the capacitor.

17. The organic light emitting display apparatus of claim 16, further comprising:
a connection wiring disposed on the interlayer insulating film, wherein the connection wire connects the first electrode of the capacitor and a thin film transistor through a contact hole defined through the second insulating film and the interlayer insulating film in a region corresponding to the opening in the second electrode of the capacitor.

18. The organic light emitting display apparatus of claim 17, further comprising:
a compensation thin film transistor which compensates a threshold voltage of the driving thin film transistor; and
an initialization thin film transistor which transmits an initialization voltage to the gate electrode of the driving thin film transistor.

19. The organic light emitting display apparatus of claim 18, wherein
a gate electrode of the compensation thin film transistor and a gate electrode of the initialization thin film transistor are disposed in a same layer as the first electrode of the capacitor.

20. The organic light emitting display apparatus of claim 17, further comprising:

a driving voltage line disposed in a same layer as the connection wiring and connected to the second electrode of the capacitor, wherein the driving voltage line transmits a driving voltage to the second electrode of the capacitor.

\* \* \* \* \*